United States Patent [19]

Hayashi et al.

[11] Patent Number: 5,639,579

[45] Date of Patent: Jun. 17, 1997

[54] PHOTOSENSITIVE COLORED RESIN COMPOSITION, COLORED IMAGE FORMATION METHOD OF COLOR FILTER, AND FORMATION METHOD OF BLACK MATRIX

[75] Inventors: Keiichi Hayashi; Nobuyuki Kurata; Keiji Ishii; Hideo Kikuchi, all of Funabashi, Japan

[73] Assignee: Toyo Gosei Kogyo Co., Ltd., Japan

[21] Appl. No.: 480,831

[22] Filed: Jun. 7, 1995

Related U.S. Application Data

[63] Continuation of Ser. No. 781,768, Oct. 23, 1991, abandoned.

[30] Foreign Application Priority Data

| Oct. 29, 1990 | [JP] | Japan | 2-288504 |
| Nov. 13, 1990 | [JP] | Japan | 2-303763 |
| Nov. 13, 1990 | [JP] | Japan | 2-303764 |

[51] Int. Cl.$^6$ ............................................ G03F 9/00
[52] U.S. Cl. ............................................ 430/7
[58] Field of Search ............................................ 430/7

[56] References Cited

U.S. PATENT DOCUMENTS

| 4,503,134 | 3/1985 | Matsumoto et al. | 430/7 |
| 4,808,501 | 2/1989 | Chiulli | 430/7 |

*Primary Examiner*—Mark Chapman
*Attorney, Agent, or Firm*—Bierman, Muserlian and Lucas, LLP

[57] ABSTRACT

A photosensitive colored resin composition for the formation of colored images includes (a) a resin-based material hardenable with an acid, (b) a photoreactive acid-releasing agent, and (c) a pigment.

A colored image formation method of a color filter suitable for liquid crystal display panel applications includes the steps of:

(1) coating a photosensitive colored resin composition including (a) a resin-based material hardenable with an acid, (b) a photoreactive acid-releasing agent, and (c) a pigment on a transparent substrate, and drying the coating to form a colored resin layer;

(2) pattern exposing the colored resin layer;

(3) heating the exposed colored resin layer; and (4) developing the exposed and heated colored resin layer with an alkaline developing solution to form a colored image on the transparent substrate, the steps being repeated to form a multi-colored image on the same substrate.

A formation method of a black matrix for the formation of a color filter having red, green, and blue picture elements and a black matrix provided on a transparent substrate includes the steps of:

(1) coating a photosensitive black resin composition comprising (a) a resin-based material hardenable with an acid, (b) a photoreactive acid-releasing agent, and (c) a black pigment on a transparent substrate, and drying the coating to form a black resin layer;

(2) pattern exposing the black resin layer;

(3) heating the exposed black resin layer; and (4) developing the exposed and heated black resin layer.

12 Claims, No Drawings

PHOTOSENSITIVE COLORED RESIN COMPOSITION, COLORED IMAGE FORMATION METHOD OF COLOR FILTER, AND FORMATION METHOD OF BLACK MATRIX

PRIOR APPLICATION

This application is a continuation of U.S. patent application Ser. No. 07/781,768 filed Oct. 23, 1991 now abandoned.

FIELD OF THE INVENTION

This invention relates to a photosensitive colored resin composition for the formation of a colored image, a formation method of a colored image of a color filter suitable for use in liquid crystal display panels, and a formation method of a black matrix.

BACKGROUND OF THE INVENTION

In general, color filters used in solid state camera devices, liquid crystal display devices and the like are based on a transparent substrate, with color elements arranged thereon, for example, in mozaic structures, stripes, or triangles.

Currently these color filters are mainly produced using a dyeing technique.

In the dyeing technique, a dyeable water-soluble polymer such as gelatin, fish glue, casein, or polyacrylamide is mixed with a bichromate salt or a water-soluble azide to make it photosensitive, which is then irradiated through a photomask and developed with water to obtain a relief pattern. The relief pattern is dyed to form a colored image. This process is repeated three times to form red, green, and blue filters. Between the individual processes, the filter is, for example, resist treated with tannic acid, or provided with an intermediate layer of urethane resin or acrylic resin to prevent color mixing.

However, such a prior art dyeing method has problems in that (1) the process is complicated, (2) it is difficult to control the dyeing bath, (3) the dyed medium (water-soluble polymer) is inferior in heat resistance, and (4) the dye is inferior in heat resistance and weather resistance.

To overcome such disadvantages, recent development of color filter is being actively conducted using such techniques as a printing method or a pigment dispersion method.

The printing method uses an ink comprising a pigment dispersed in an organic vehicle, which is printed onto a transparent substrate to form a colored image. This method allows film formation and patterning to be simultaneously carried out, is simple in process, and is superior in durability. However, this method involves new problems such as (1) fringing, (2) poor dimensional accuracy, and (3) poor surface smoothness.

The pigment dispersion method has improved the above problems. In this method, a pigment is dispersed in a photosensitive resin, which is coated onto a transparent substrate, exposed, and developed to form a colored image. This method can produce a color filter by a simple process compared to the dyeing method. As photosensitive resins used in the pigment dispersion method, there have been proposed various types of resins such as stilbazolium group-pendant polyvinylalcohol disclosed in Japanese Patent Publication Laid-open 60-124738/1985, photosensitive polyimide and polyamide disclosed in Japanese Patent Publication Laid-open 60-237403/1985 and Japanese Patent Publication Laid-open 62-212603/1987, a photosensitive resin comprising an acrylic polymer and bis-diazide compound disclosed in Japanese Patent Publication Laid-open 1-200353/1989, and a radical polymerization type photosensitive resin comprising a multifunctional acrylate monomer, an organic polymer binder, and a photopolymerization initiator disclosed in Japanese Patent Publication Laid-open 1-152449/1989.

However, of these photosensitive resins used in the pigment dispersion method, the stilbazolium group-pendant polyvinylalcohol is inferior in heat resistance. To improve this problem, Japanese Patent Publication Laid-open 2-160807/1990 proposes stilbazolium group-pendant polyvinylalcohol having a betaine structure, however, this substance is still insufficient in heat resistance.

Furthermore, a photosensitive resin using a photosensitive polyimide or polyamide has a high heat resistance, however, involves problems such as: (1) the resin is colored, (2) the resin is low in sensitivity, and (3) it must be developed with an organic solvent. A system using bis-azide compounds as a photosensitive agent (1) is low in sensitivity, and (2) tends to be affected by oxygen during exposure. A system using radical polymerization is high in sensitivity but tends to be affected by oxygen during exposure. To prevent this, the resin must be exposed in an inert gas atmosphere or an oxygen barrier film must be provided, which requires use of an expensive device or a complex process.

With a view to eliminate such prior art problems, it is a primary object of the present invention to provide a photosensitive colored resin composition which (1) is high in sensitivity, (2) is not affected by oxygen, (3) is superior in heat resistance, and (4) can be developed with an aqueous developer. Another object of the present invention is to provide a colored image formation method for a color filter by using the inventive photosensitive colored resin composition to form successive patterns of the color filter.

The color filter normally has B (blue), R (red), and G (green) picture elements arranged on a transparent substrate. To obtain an image of good contrast, it is necessary to form a black matrix which is a light blocking between the picture elements. In an active type display device using a switching device, in particular, this light blocking film can remove unnecessary light, thereby reducing misoperation due to light from the switching device.

Prior art formation methods of the black matrix include (1) patterning a dyeable synthetic resin and dyeing with a black dye, (2) formation by printing, and (3) deposition of a metal such as chromium.

However, the prior art formation methods of black matrix have the following problems:

The dyeing method of (1) is difficult to obtain a sufficient density and complex in process.

The printing method of (2) is simple with reduced process steps, butt is low in precision of fine lines and positioning and difficult to obtain a sufficient density.

The deposition method of (3) is very costly.

Therefore, in order to maintain the lightness of the entire image and obtain a high-precision image and the black matrix formation, a formation method is in demand which can provide a sufficient density to block light and enables high-precision fine lines at a low cost.

With a view to eliminate the above prior art problems, it is another object of the present invention to provide a formation method of a low-cost black matrix which has a sufficient light blocking ability, is high in precision, and involves reduced process steps.

SUMMARY OF THE INVENTION

In accordance with the present invention which attains the above objects, there is provided a photosensitive colored resin composition comprising (a) a resin-based material hardenable with an acid, (b) a photoreactive acid-releasing agent, and (c) a pigment.

There is also provided according to the present invention a colored image formation method for a color filter comprising the steps of:

(1) coating a photosensitive colored resin composition comprising (a) a resin-based material hardenable with an acid, (b) a photoreactive acid-releasing agent, and (c) a pigment on a transparent substrate, and drying the coating to form a colored resin layer;

(2) pattern exposing the colored resin layer;

(3) heating the exposed colored resin layer; and (4) developing the exposed and heated colored resin layer with an alkaline developing solution to form a colored image on the transparent substrate, the steps being repeated to form a multi-colored image on the same substrate.

There is further provided according to the present invention a formation method of a black matrix for the formation of a color filter having red, green, and blue picture elements and a black matrix provided on a transparent substrate, comprising the steps of:

(1) coating a photosensitive black resin composition comprising (a) a resin-based material hardenable with an acid, (b) a photoreactive acid-releasing agent, and (c) a black pigment on a transparent substrate, and drying the coating to form a black resin layer;

(2) pattern exposing the black resin layer;

(3) heating the exposed black resin layer; and (4) developing the exposed and heated black resin layer.

DETAILED DESCRIPTION OF THE INVENTION

The present invention will now be described in detail. The photosensitive colored resin composition used in the present invention contains (a) a resin-based material which is hardenable with an acid, (b) a photoreactive acid-releasing agent, and (c) a pigment as essential constituents.

The resin-based material of (a) which is hardenable with an acid used in the photosensitive colored resin composition according to the present invention includes, for example, resin-based materials comprising a cross-linking agent having a N-methylol structure like amino resins such as urea resin and melamine resin and a resin having a phenolic hydroxyl group or a carboxyl group, resin-based materials comprising epoxy resin and phenolic resin, and a copolymer having a hydroxystyrene structure such as of p-hydroxystyrene and p-acetoxymethylstyrene disclosed in J. Photopolym. Sci. Technol. Vol. 3, No. 3(1990) p235–247, which are hardenable with an acid.

It is preferable that the resin-based material is soluble in developing solutions (organic and inorganic), particularly preferable to be soluble in an aqueous alkaline developing solution. This is because organic developing solutions involve health problems of operators and require ventilation equipment and the like, which are not desirable.

In the above resin-based materials, the cross-linking agent having a N-methylol structure can be, for example, methylolurea, urea resin, methylolmelamine, methylolguanamine, methylolglyoxal-diurein, methyloluron, methylol-tetrahydropyrimidone derivatives, methyloltriazine, or alkyl ethers thereof. Of these substances, it is preferable to use an alkyl ether for its good storage stability. It is particularly preferable that the alkyl group of the alkyl ether is an alkyl of 1 to 5 carbon atoms.

In the above resin-based materials, the resin having a phenolic hydroxyl group can be, for example, alkali-soluble phenolic resin, novolac resin, a polymer having a hydroxystyrene structure, a polymer containing the structure of the following Formula (I), an alkali-soluble polyimide having a phenolic hydroxyl group, or the like.

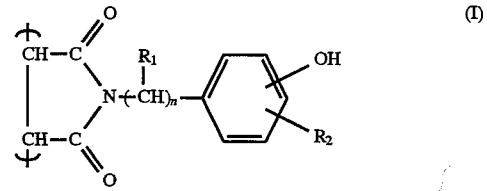

(wherein $R_1$ is hydrogen, alkyl or aryl, $R_2$ is hydrogen, halogen, alkyl or alkoxy, and n is an integer from 0 to 6.)

The novolac resin is obtained by condensing phenols and aldehydes or ketones in the presence of an acid catalyst. Phenols used in this case include, for example, phenol, cresol, ethylphenol, butylphenol, xylenol, phenylphenol, hydroquinone, catechol, resorcinol, pyrogallol, naphthol, bisphenol-A and the like. These phenols can be used alone or in combinations of two or more. The aldehydes and ketones include, for example, formaldehyde, paraformaldehyde, acetaldehyde, propionaldehyde, benzaldehyde, acetone, methylethylketone and the like.

In the resin-based materials, the polymer containing a hydroxystyrene structure can be, for example, hydroxystyrene or α-methyl-hydroxystyrene, alone or in combination of two or a copolymer with styrene or an acrylic monomer. The acrylic monomer as the comonomer can be, for example, acrylic esters, methacrylic esters, acrylamide, methacrylamide, acrylonitrile or the like.

The polymer containing a maleimide derivative structure of Formula (I) is disclosed, for example, in Japanese Patent Publication 61-162039/1986, Japanese Patent Publication 62-151408/1987, and Japanese Patent Publication 62-151409/1987.

The alkali-soluble polyimide having a phenolic hydroxyl group can be, for example, one which is described in J. Photopolym. Sci. Technol., Vol. 3, No. 3 (1990) p275–280.

In the resin-based materials, the resin having a carboxyl group can be, for example, copolymers of such unsaturated organic acids as acrylic acid, methacrylic acid, vinylbenzoic acid or the like with unsaturated monomers such as acrylic ester, methacrylic ester, or acrylonitrile.

In the resin-based materials, the epoxy resin can be, for example, novolac type epoxy resin, bisphenol-A type epoxy resin, brominated bisphenol-A type epoxy resin, alicyclic epoxy resin or the like.

The photoreactive acid-releasing agent of (b) used in the present invention is a compound which releases an acid upon irradiation with light, and various known compounds or mixtures thereof can be used. Suitable compounds include, for example, (i) onium salts such as of halogen⁻, $BF_4^-$, $PF_6^-$, $AsF_6^-$, $SbF_6^-$, $ClO_4^-$, and $CF_3SO_4^-$; (ii) organic halogen compounds; (iii) naphthoquinone-diazide-sulfonic acid compounds; and (iv) photoreactive sulfonic acid-releasing compounds.

More specifically, (i) as onium salts, (1) examples of ammonium salts are disclosed in U.S. Pat. No. 4,069,055 and U.S. Pat. No. 4,069,056; (2) examples of diazonium salts are disclosed in Photogr. Sci. Eng., 18, 387(1974), J. Macromol. Sci., Chem. A21, 1695(1984), and Polymer, 21, 423(1980); (3) examples of iodonium salts are disclosed in Macromolecules, 10, 1307(1977), Chem., & Eng. News, Nov. 28, P31(1988, and European Patent 0,104,143; (4) examples of sulfonium salts are disclosed in Polymer J., 17, 73(1985), Polymer Bull., 14, 279(1985), J. Polymer Sci., 17, 977(1979), J. Org. Chem., 43, 3055(1978), J. Org. Chem., 50 4380(1985), Japanese Patent Publication Laid-open 57-18723/1982, Japanese Patent Publication Laid-open 56-8428/1981, U.S. Pat. No. 4,760,013, U.S. Pat. No. 4,139, 655, U.S. Pat. No. 4,734,444, and European Patent 0297, 433; (5) examples of phosphonium salts are disclosed in U.S. Pat. No. 4,069,055, U.S. Pat. No. 4,069,056, and Macromolecules, 17, 2469(1984); (6) examples of selenonium salts are disclosed in Macromolecules, 10, 1307 (1977) and J. Polymer Sci., Polymer Chem. Ed., 17, 1047 (1979); and (7) examples of arsonium salts are disclosed in Proc. Conf. Rad. Curing ASIA p478 Tokyo, Oct.(1988).

(ii) Examples of the organic halogen compounds which release an acid upon irradiation with light include (1) carbon tetrachloride, iodoform, tribromo-acetophenone, phenyl-trihalomethyl-sulfone compounds described in Japanese Patent Publication 46-4605/1971; halomethyl-S-triazine compounds described in Japanese Patent Publication 48-36281/1973, Japanese Patent Publication Laid-open 53-133428/1978, Japanese Patent Publication Laid-open 60-105667/1985, and Japanese Patent Publication Laid-open 60-239736/1985; and halomethyl-oxadiazole compounds described in Angew. Physik. Chem., 24, 381(1918), J. Phys. Chem., 66, 2449(1962), Japanese Patent Publication Laid-open 54-74728/1979, Japanese Patent Publication Laid-open 55-77742/1980, Japanese Patent Publication Laid-open 59-148784/1984, Japanese Patent Publication Laid-open 60-3626/1985, Japanese Patent Publication Laid-open 60-138539/1985, and Japanese Patent Publication Laid-open 60-239473/1985.

(iii) The naphthoquinone-diazide compounds include, for example, 1,2-naphthoquinone-diazide-(2)-4-sulfonylchloride.

(iv) Photoreactive sulfonic acid compounds include, for example, 1,2-naphthoquinone-diazide-(2)-4-sulfonic esters or amides, β-ketosulfonic compounds described in Polymer Preprints, Japan 35, 2408(1986), esters of nitrobenzylalcohol and arylsulfonic acid described in Macromolecules, 21, 2001(1988) and Japanese Patent Publication 64-18143, esters of oxime and arylsulfonic acid described in European Patents 0,04,155 and 0,199,672, esters of N-hydroxyamide or imide and sulfonic acid described in U.S. Pat. No. 4,258,121, U.S. Pat. No. 4,371,605, and U.S. Pat. No. 4,618,564, and esters of benzoin and sulfonic acid described in European Patents 84515 and 199,672.

Of these photoreactive acid-releasing agents, (ii) organic halogen compounds, especially halomethyl-S-triazine compounds and halomethyl-oxadiazole compounds, and (iv) photoreactive sulfonic acid-releasing compounds are preferable for their good cross-linking efficiencies.

These photoreactive acid-releasing agents may be used alone or as mixtures thereof. The photoreactive acid-releasing agent is added preferably in an amount of 0.1 to 50% by weight, more preferably 0.5 to 30% by weight, to the solid ingredients of the resin-based material which is hardenable with the acid of (a). When the amount is less than 0.1% by weight, the acid releasing amount is small and the cross-linking reaction is hard to take place. Addition in an amount exceeding 50% by weight cannot be expected to provide further weighting effect and tends to deteriorate the developability. Therefore, both cases are not preferable.

The photoreactive acid-releasing agent can be used, as needed, with a sensitizer to enhance the acid-releasing efficiency.

As such a sensitizer, known sensitizers can be used, for example, anthracene, phenanthrene, perylene, pyrene, chrysene, 1,2-benzoanthracene, coronene, 1,6-diphenyl-1,3, 5-hexatriene, 1,1,4,4-tetraphenyl-1,3-butadiene, 2,3,4,5-tetraphenylfuran, 2,5-diphenyl-thiophene, thioxanthone, 2-chloro-thioxanthone, phenothiazine, 1,3-diphenyl-pyrazoline, 1,3-diphenyl-isobenzofuran, xanthone, benzophenone, 4-hydroxy-benzophenone, anthrone, ninhydrin, 9-fluorenone, nitropyrene, 2,4,7-trinitrofluorenone, indanone, phenanthraquinone, tetralone, 7-methoxy-4-methylcoumalin, 3-keto-bis(7-diethylaminocoumalin), fluorocene, eosin, rhodamine S, triphenylpyrylium perchlorate and the like.

Molar ratio of the sensitizer and the (b) photoreactive acid-releasing agent is 0.01/1 to 10/1, preferably 0.1/0 to 5/1.

Furthermore, the sensitivity of the inventive composition can be enhanced by selecting the type of the sensitizer according to the type of pigment used.

(c) Pigment used in the present invention is a colored powder which is sparingly soluble in water or organic solvents, preferably having good resistance to light and solvents. Such a pigment includes, for example, organic pigments such as those of azo type, anthraquinone type, isoindolinone type, indigo type, indanthrone type, xanthene type, quinacridon type, quinophthalone type, dioxazine type, thioindigo type, pyranthrone type, phthalocyanine type, perinone type, perylene type, and benzoindanthrone type; and inorganic pigments such as milori blue, ultramarine blue, cobalt blue, emerald green, carbon, titanium carbon, and iron oxide. These pigments can be used by selecting one or more types.

When used in color filters or the like, the pigments preferably have a particle diameter of 1 μm or less in view of the light transmittance and uniformity of the film formed.

In particular, black pigments for the formation of a black matrix include carbon black, iron black, aniline black, cyanine black, and titanium black, which can be used by selecting one or more types.

In the present invention, the weight ratio of Formula (1) below is 95/5 to 10/90, preferably 90/10 to 40/60:

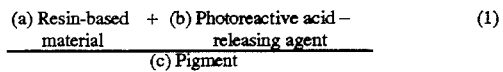

This is because when the weight ratio is less than 95/5, the film thickness to obtain a desirable color density tends to become too thick, and when the weight ratio exceeds 10/90, dispersion stability and film-forming properties tend to be deteriorated; both cases are not preferable.

To obtain the photosensitive colored resin composition according to the present invention, (a) the acid-hardenable resin-based material and (b) the photoreactive acid-releasing agent are dissolved in a solvent, and dispersed with the pigment.

The solvent used in the present invention can be, for example, ethers such as dioxane, diethoxyethane, diethyleneglycol-dimethylether, methylcellosolve, ethylcellosolve, ethyleneglycol-monoisopropylether, propyleneglycol-monomethylether, propyleneglycol-monoethylether and the like; ketones such as acetone, methylethylketone, methylisobutylketone, cyclopentanone, cyclohexanone and the like; esters such as ethyl acetate, butyl acetate, methylcellosolve acetate, ethylcellosolve acetate, propyleneglycol-monomethyletheracetate, propyleneglycol-monoethylether acetate, dimethyloxalate, methyl lactate, ethyl lactate and the like; amides such as N,N-dimethylformamide, N,N-dimethylacetamide and the like; pyrrolidones such as N-methyl-pyrrolidone and the like; lactones such as δ-butyrolactone and the like; and sulfoxides such as methylsulfoxide and the like. These solvents can be used alone or in combinations of two or more. Concentration (total solid including additives) in the composition is 2 to 70% by weight, more preferably 5 to 50% by weight.

The photosensitive colored resin composition according to the present invention can be further mixed, as needed, with other additives in order to adjust the viscosity of the composition, improve the dispersion stability of the pigment, improve the coating performance, improve the adhesion of the coating film to the substrate, improve the flatness of the coating film, improve the developing characteristics and the like.

The transparent substrate which is coated with the photosensitive resin composition includes, for example, glass plates, plastic plates, and plastic films. Such glass plates include those of soda glass used in liquid crystal display devices and the like, borosilicate glass, quartz glass, and those glass plates coated with transparent electroconductive films. Furthermore, a substrate of photoelectric conversion devices used as solid state camera devices such as a silicon substrate can be used.

An example of colored image formation method using the above-described photosensitive colored resin composition will now be described. The colored image formation method of a color filter according to the present invention comprises the steps in which: (1) the photosensitive colored resin composition of the above composition is coated on the transparent substrate and dried to form a colored resin layer, (2) the colored resin layer is exposed by irradiation with light according to a predetermined pattern, (3) the layer is heated at a temperature of approximately 50° to 200° C., and (4) the layer is developed with a developing solution to form a colored image on the transparent substrate. The steps of (1) to (4) are repeated to form multicolor images of a color filter such as of blue (B), red (R), and green (G) on the same substrate.

Coating of the resin composition is achieved using a conventional method known in the art, for example, by rotary coating, wire bar coating, dip coating, air knife coating, roll coating, blade coating, curtain coating, screen printing coating or the like.

Drying of the colored resin layer in step (1) is carried out at a temperature of approximately 50° to 150° C. for 30 seconds to 30 minutes.

Irradiation in step (2) is achieved using, for example, visible light, ultraviolet light, X-rays, an electron beam, or the like.

Heat treatment of the resin layer in step (3) is to cross-link and harden the resin of the exposed portion, making it insoluble in the developing solution. The heat treatment is achieved at approximately 50° to 200° C., preferably at 70° to 160° C.

The developing solution in step (4) is an alkaline aqueous solution of, for example, an inorganic alkali such as sodium hydroxide, potassium hydroxide, sodium carbonate, sodium metasilicate, potassium metasilicate, disodium hydrogen phosphate, trisodium phosphate, ammonia or the like; an alkylamine such as ethylamine, n-propylamine, diethylamine, di-n-propylamine, triethylamine, methyldiethylamine or the like; alcoholamines such as diethanolamine, triethanolamine or the like; a quaternary ammonium salt such as tetramethylammonium hydroxide, tetraethylammonium hydroxide, trimethyl-(2-hydroxyethyl)-ammonium hydroxide or the like; and a cyclic amine such as pyrrole, piperidine or the like.

Furthermore, the developing solution can be mixed, as needed, with other additives such as a surfactant, a wetting agent, a stabilizer, a small amount of organic solvent and the like.

The colored resin layer is developed with the above developing solution to form a first pattern. Then, a second pattern and a third pattern are formed successively in the spacing between the first pattern by repeating the above steps (1) to (4), whereby a BRG color filter image is obtained.

Even if light-blocking films are provided between individual colors of the colored image, these films do not affect the colored image formation method according to the present invention.

To form a black matrix according to the present invention, the same procedure can be employed using a black resin composition. The transparent substrate which is coated with the black resin composition may already be formed with red(R), green (G), and blue (B) picture elements.

DESCRIPTION OF THE PREFERRED EMBODIMENTS

The present invention will now be described further in detail with reference to the Examples.

EXAMPLES 1 TO 9

Of compositions 1 to 10 shown in Table 1 below, an acid-hardenable resin-based material of (a) and a photoreactive acid-releasing agent of (b) were dissolved in a solvent, mixed with a pigment of (c), dispersed using a three-roll mixer, diluted with the solvent to a predetermined concentration, and filtered using a 1-μm polyester filter to obtain individual photosensitive colored resin compositions.

The individual photosensitive colored resin compositions were spinner coated on a soda glass substrate formed with a $SiO_2$ film, and dried at 80° C. for 10 minutes. The colored photosensitive resin layer was exposed using a metal halide lamp through a mask of predetermined shape in an air atmosphere.

The pattern-exposed colored photosensitive resin layer was then heated to 140° C. for 10 minutes, and developed with a 2.38% tetramethylammonium hydroxide aqueous solution to obtain a colored pattern.

The thus obtained colored pattern was uniform with sharp edges.

Furthermore, the patterns of Examples 1 to 9 were heated at 230° C. for 1 hour, and measured for absorption spectrum before and after heating. As a result, no changes in spectrum were noted for all of the Examples.

TABLE 1

| Composition | (a) Acid-hardenable resin system | Amount | (b) Photoreactive acid-releasing agent | Amount | (c) Pigment | Amount | Solvent | Amount |
|---|---|---|---|---|---|---|---|---|
| Composition 1 | 1:1 copolymer of vinylphenol and methylmethacrylate 1) Hexamethoxymethyl-melamine 2) | 7.1 g 2.1 g | Photoreactive acid-releasing agent I | 0.8 g | Phthalocyanine blue | 2.8 g | Diethylene-glycol-dimethylether | 40 g |
| Composition 2 | 1:1 copolymer of vinylphenol and N-(4-hydroxyphenyl)-maleimide Methanol/ethanol-modified benzoguanamine 3) | 9.4 g 2.2 g | Photoreactive acid-releasing agent I | 0.8 g | Phthalocyanine blue | 3.0 g | Diethylene-glycol dimethylether | 40 g |
| Composition 3 | 1:1 copolymer of vinylphenol and methylmethacrylate 1) Hexamethoxymethyl-melamine 2) | 7.1 g 2.1 g | Photoreactive acid-releasing agent II | 0.8 g | Phthalocyanine green | 3.5 g | Ethyl-cellosolve-diacetate | 40 g |
| Composition 4 | 1:1 copolymer of vinylphenol and styrene 4) Hexamethoxymelamine 2) | 7.1 g 2.1 g | Photoreactive acid-releasing agent II | 0.8 g | Carmine 6B | 3.0 g | Ethyl-cellosolve-diacetate | 40 g |
| Composition 5 | Cresol-novolac resin Hexamethoxymelamine 2) | 7.1 g 2.1 g | Photoreactive acid-releasing agent III Sensitizer I | 0.8 g 0.2 g | Carbon black | 3.0 g | Diethylene-glycol-dimethylether | 40 g |
| Composition 6 | Cresol-novolac resin Bisphenol-A diglycidylether | 8.0 g 1.5 g | Photoreactive acid-releasing agent IV Sensitizer 1 | 1.2 g 0.3 g | Carbon black | 3.0 g | Diethylene-glycol-dimethylether | 40 g |

1) Maruzen Petrochemical LYNCUR-CMM (brandname)
2) Mitsui Cyanamide CYMEL 300 (brandname)
3) Mitsui Cyanamide CYMEL 1123 (brandname)
4) Maruzen Petrochemical LYNCUR-CST (brandname)

TABLE 2

| Composition | (a) Acid-hardenable resin system | Amount | (b) Photoreactive acid-releasing agent | Amount | (c) Pigment | Amount | Solvent | Amount |
|---|---|---|---|---|---|---|---|---|
| Composition 7 | 1:1 copolymer of vinylphenol and methylmethacrylate 1) Hexamethoxymethyl-melamine 2) | 7.1 g 2.1 g | Photoreactive acid-releasing agent II | 0.8 g | Carmine 6B | 3.0 g | Ethyl-cellosolve acetate | 40 g |
| Composition 8 | Copolymer of vinylphenol and methylmethacrylate Methanol/ethanol-modified benzoguanamine 3) | 7.1 g 2.1 g | Photoreactive acid-releasing agent I Sensitizer I | 0.8 g 0.2 g | Phthalocyanine green | 3.5 g | Ethyl-cellosolve acetate | 40 g |
| Composition 9 | Polyvinylphenol Methanol/ethanol-modified benzoguanamine 3) | 7.1 g 2.2 g | Photoreactive acid-releasing agent I Sensitizer II | 0.8 g 0.9 g | Carbon black Titanium black | 2.5 g 1.5 g | Ethyl-cellosolve acetate | 40 g |

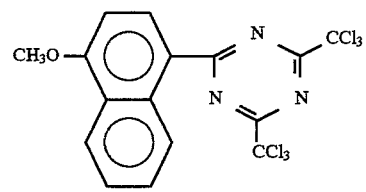

Photoreactive acid-releasing agent I

-continued

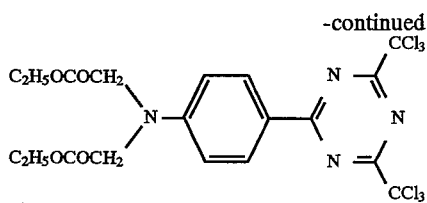

Photoreactive acid-releasing agent II

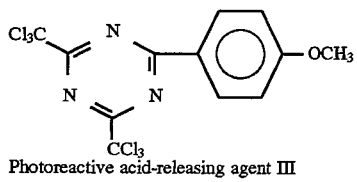

Photoreactive acid-releasing agent III

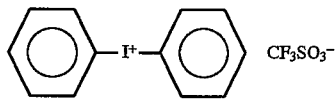

Photosensitive acid-releasing agent IV

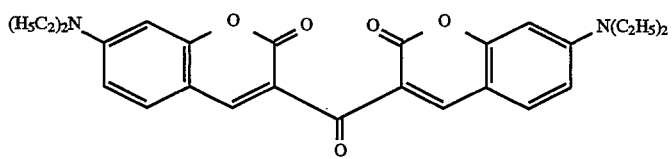

Sensitizer I

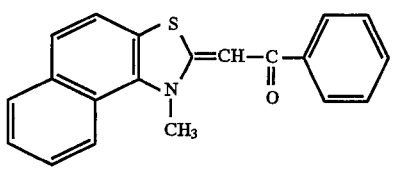

Sensitizer II

EXAMPLE 10

The same compositions as Examples 1 to 9 were exposed in a $N_2$ gas atmosphere to form colored patterns. As a result, the compositions were hardened in the same exposure time as Examples 1 to 9, and no difference due to an effect of the $N_2$ gas atmosphere was noted.

EXAMPLE 11

According to Composition 7, a photosensitive colored resin composition comprising the acid-hardenable resin-based material of (a) and the photoreactive acid-releasing agent of (b), dissolved in a solvent and mixed with a pigment of (c), was spinner coated to a thickness of 1 µm on a soda glass substrate formed on the surface with a $SiO_2$ film, and dried at 80° C. for 10 minutes.

The resulting colored photosensitive resin layer was exposed with a metal halide lamp through a mask of predetermined shape in an air atmosphere.

The pattern-exposed colored photosensitive resin layer was then heated in an oven at 140° C. for 10 minutes, followed by development with a 2.38% tetramethylammonium-hydroxide aqueous solution to obtain an R-colored pattern.

The resulting R-colored pattern was uniform with no uneven thickness and with sharp edges.

The thus obtained glass substrate formed with the R-colored pattern was spinner coated with the photosensitive colored resin composition of Composition 8, and dried at 80° C. for 10 minutes.

The resulting colored photosensitive resin layer was exposed with a metal halide lamp through a photomask, and then heated in an oven at 140° C. for 10 minutes.

The resulting layer was developed with a 2.38% tetramethylammonium hydroxide aqueous solution, whereby the substrate was formed with R- and G-colored images.

The glass substrate formed with the R- and G-colored patterns was spinner coated with the photosensitive colored resin composition of Composition 1, and dried at 80° C. for 10 minutes.

The resulting layer was exposed with a metal halide lamp through a photomask, and then heated in an oven at 140° C. for 10 minutes.

The layer was developed with a 2.38% tetramethylammonium hydroxide aqueous solution, whereby the substrate was formed with a RGB-colored image.

The individual color element patterns of the thus obtained colored image were sharp and had no irregularities, with satisfactory color densities and tints.

Furthermore, even after the image was heated at 230° C. for 1 hour, the spectral transparency characteristics of the image were almost unchanged.

EXAMPLE 12

According to composition 5, a photosensitive colored resin composition comprising the acid-hardenable resin-based material of (a) and the photoreactive acid-releasing agent of (b), dissolved in a solvent and mixed with a black pigment of (c), was spinner coated to a thickness of 2 µm on a soda glass substrate formed on the surface with a SiO$_2$ film, and dried at 80° C. for 10 minutes.

The resulting black photosensitive resin layer was exposed with a metal halide lamp through a mask of predetermined shape in an air atmosphere.

The exposed black photosensitive resin layer was then heated in an oven at 130° C. for 20 minutes, followed by development with a 2.38% tetramethylammonium-hydroxide aqueous solution to form a black matrix.

The resulting black matrix had an optical density of 2.3.

EXAMPLE 13

A soda glass substrate having a SiO$_2$ film, formed on top with red, green, and blue picture elements by printing, was coated with the photosensitive black resin composition of Composition 9 using the same procedure as in Example 1 to form a black matrix, obtaining a color filter provided with a black matrix.

As described above in detail with reference to the Examples, the present invention can easily form a colored image of color filter with no irregularities and with good heat resistance, by a simple process using a photosensitive colored composition, which has a high sensitivity, is not affected by oxygen during exposure, is superior in heat resistance, and can be developed with an aqueous developing solution, and repeating a series of image formation steps.

Especially, the present invention can easily form a black matrix, which has a sufficient light blocking ability and high precision, requires a reduced number of steps, and is low in cost, using a photosensitive black resin composition.

Therefore, the method according to the present invention can easily fabricate high-quality, reliable liquid crystal displays, liquid crystal color TVs, color image sensors and the like.

We claim:

1. A black matrix formation method of a color filter provided with red, green and blue elements and a black matrix formed on a transparent substrate comprising the steps of:

(1) coating a photosensitive black resin composition comprising
(a) a resin-based material hardenable with an acid,
(b) a photosensitive acid-releasing agent, and
(c) a black pigment on a transparent substrate, and drying to form a black resin layer.

(2) exposing said black resin layer with a pattern;

(3) heating said exposed black resin layer; and (4) developing said exposed and heated black resin layer with an alkaline developing solution.

2. The black matrix formation method of claim 1 wherein said resin-based material hardenable with an acid comprises a resins containing a phenol and a cross-linking agent having an N-methylol structure.

3. A colored filter produced by the method of claim 1.

4. A liquid crystal display panel having a color filter of claim 3.

5. The method of claim 1 wherein said resin-based material hardenable with an acid comprises a resin containing a phenol and a cross-linking agent having an N-methylol structure.

6. A colored image formation method of a color filter comprising the steps of:

(1) coating a photosensitive colored resin composition of claim 1 on a transparent substrate, and drying to form a colored resin layer;

(2) exposing said colored resin layer with a pattern;

(3) heating said exposed colored resin layer; and (4) developing said exposed and heated colored resin layer with an alkaline developing solution to form a colored image on said transparent substrate;

the steps being repeated to form a multicolored image on the same substrate.

7. The colored image formation method of claim 6 wherein said (a) resin-based material hardenable with an acid comprises a resin containing a phenol and a cross-linking agent having an N-methylol structure.

8. A colored filter produced by the method of claim 6.

9. A photosensitive colored resin composition comprising (a) a resin-based material hardenable with an acid, (b) a photoreactive acid-releasing agent, and (c) a pigment in a weight ratio of $$\frac{\text{(a) Resin-based material} + \text{(b) Photoreactive acid releasing agent}}{\text{(c) Pigment}} = \frac{90}{10} \text{ to } \frac{40}{60} \text{ by weight.}$$

10. A composition of claim 9 containing 0.1 to 50% by weight of component (b) with respect to the component (a).

11. The black matrix formation method of claim 9 wherein said resin-based material hardenable with an acid comprises a resin containing a phenol and a cross-linking agent having an N-methylol structure.

12. The photosensitive colored resin composition of claim 9 wherein said resin-based material hardenable with an acid comprises a resin containing a phenol and a cross-linking agent having an N-methylol structure.

* * * * *